(12) United States Patent
Yu et al.

(10) Patent No.: US 10,985,139 B2
(45) Date of Patent: Apr. 20, 2021

(54) SEMICONDUCTOR CHIP FOR SENSING TEMPERATURE AND SEMICONDUCTOR SYSTEM INCLUDING THE SAME

(71) Applicant: Samsung Electronics Co., Ltd., Suwon-si (KR)

(72) Inventors: Ki Hun Yu, Seoul (KR); Tae Young Oh, Seoul (KR); Nam Jong Kim, Suwon-si (KR); Kwang Il Park, Yongin-si (KR); Chul Sung Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 335 days.

(21) Appl. No.: 16/151,652

(22) Filed: Oct. 4, 2018

(65) Prior Publication Data
US 2019/0043839 A1 Feb. 7, 2019

Related U.S. Application Data

(63) Continuation of application No. 14/823,322, filed on Aug. 11, 2015, now Pat. No. 10,115,702.

(30) Foreign Application Priority Data

Nov. 20, 2014 (KR) .......... 10-2014-0162641

(51) Int. Cl.
G01K 7/00 (2006.01)
G01K 3/00 (2006.01)
(Continued)

(52) U.S. Cl.
CPC .......... *H01L 25/0657* (2013.01); *H01L 23/34* (2013.01); *H01L 2224/32145* (2013.01);
(Continued)

(58) Field of Classification Search
USPC .......................................... 374/166, 178, 110
See application file for complete search history.

(56) References Cited

U.S. PATENT DOCUMENTS 6,091,255 A 7/2000 Godfrey
7,075,847 B2 7/2006 Kim et al.
(Continued)

FOREIGN PATENT DOCUMENTS

| JP | 2011154744 A | 8/2011 |
| JP | 2013131244 A | 7/2013 |
| KR | 10-2014-0085229 A | 7/2014 |

OTHER PUBLICATIONS

Korean Office Action dated Oct. 15, 2020 for KR Patent Application No. 10-2014-0162641.

*Primary Examiner* — Mirellys Jagan
(74) *Attorney, Agent, or Firm* — Harness, Dickey & Pierce, P.L.C.

(57) ABSTRACT

In one example embodiment, a semiconductor system includes a first chip configured to generate first temperature information of the first chip, the first temperature information being based on at least one temperature measurement using at least one first temperature sensor. The semiconductor system further includes a second chip including a second temperature sensor configured to be controlled based on at least the first temperature information.

20 Claims, 16 Drawing Sheets

(51) Int. Cl.
*H01L 25/065* (2006.01)
*H01L 23/34* (2006.01)

(52) U.S. Cl.
CPC ............ *H01L 2224/32225* (2013.01); *H01L 2225/06589* (2013.01); *H01L 2924/0002* (2013.01); *H01L 2924/15311* (2013.01); *H01L 2924/181* (2013.01)

(56) References Cited

U.S. PATENT DOCUMENTS

| | | | |
|---|---|---|---|
| 7,177,218 B2 | 2/2007 | Choi et al. | |
| 7,520,669 B2 | 4/2009 | Yazawa et al. | |
| 7,532,996 B2 * | 5/2009 | Kobayashi | G01K 7/00 702/130 |
| 7,887,235 B2 | 2/2011 | Campos et al. | |
| 7,901,131 B2 | 3/2011 | Bash et al. | |
| 7,965,571 B2 | 6/2011 | Jeong et al. | |
| 8,235,593 B2 | 8/2012 | Sri-Jayantha et al. | |
| 8,272,781 B2 | 9/2012 | Nale | |
| 8,350,563 B2 | 1/2013 | Haas et al. | |
| 8,441,320 B2 | 5/2013 | Signoff et al. | |
| 8,472,275 B2 | 6/2013 | Shirota et al. | |
| 2004/0042529 A1 | 3/2004 | Covi et al. | |
| 2006/0114734 A1 * | 6/2006 | Cruz | G11C 11/406 365/222 |
| 2008/0059110 A1 * | 3/2008 | Fujisawa | G01K 7/015 702/130 |
| 2008/0170947 A1 | 7/2008 | Sutardja | |
| 2008/0267258 A1 | 10/2008 | Hokenmaier | |
| 2008/0291969 A1 | 11/2008 | Chu | |
| 2009/0168840 A1 | 7/2009 | Song et al. | |
| 2012/0287731 A1 * | 11/2012 | Kim | G11C 11/40626 365/189.07 |
| 2013/0083825 A1 | 4/2013 | Zhang et al. | |
| 2014/0003161 A1 | 1/2014 | Son et al. | |
| 2014/0098404 A1 | 4/2014 | Kambegawa | |
| 2014/0105246 A1 | 4/2014 | Andreev et al. | |
| 2015/0268101 A1 | 9/2015 | Kumahara et al. | |
| 2016/0138978 A1 | 5/2016 | Eberlein | |

* cited by examiner

SEMICONDUCTOR CHIP FOR SENSING TEMPERATURE AND SEMICONDUCTOR SYSTEM INCLUDING THE SAME

CROSS-REFERENCE TO RELATED APPLICATIONS

This application is a continuation application of U.S. application Ser. No. 14/823,322, filed on Aug. 11, 2015, which claims priority under 35 U.S.C. § 119(a) from Korean Patent Application No. 10-2014-0162641 filed on Nov. 20, 2014, the entire content of each of which is incorporated herein by reference.

BACKGROUND

Example embodiments of inventive concepts relate to a semiconductor chip and a semiconductor system including the same, and more particularly, to a semiconductor chip for preventing an error from occurring in an operation due to sudden heat generation and a semiconductor system including the same.

A semiconductor chip is an element which performs functions, such as storing data and processing data, in an electronic device. With the miniaturization of electronic devices as well as the demand for low power consumption by such electronic devices, a semiconductor chip is getting smaller and operates in association with multiple chips due to the high degree of integration.

A high heat may be locally generated in a part (e.g., a memory core for storing data) of a semiconductor chip. The semiconductor chip is likely not to operate normally due to such heat. Therefore, a semiconductor chip may include a temperature sensor inside and control an internal operation using the sensing result of the temperature sensor. However, when a hot spot where heat is concentrated is not around the temperature sensor, the temperature sensor may sense a temperature lower than the actual temperature of the hot sport in the semiconductor chip. As a result, the semiconductor chip may not operate normally and operate as if the semiconductor chip does not include a temperature sensor.

SUMMARY

Example embodiments of inventive concepts provide semiconductor chips allowing a temperature sensor to sense heat generation to prevent an erroneous operation and semiconductor systems including the same.

In one example embodiment, a semiconductor system includes a first chip configured to generate first temperature information of the first chip, the first temperature information being based on at least one temperature measurement using at least one first temperature sensor. The semiconductor system further includes a second chip including a second temperature sensor configured to be controlled based on at least the first temperature information.

In yet another example embodiment, the second temperature sensor includes a sensor activation block configured to generate a start-up signal, the start-up signal being enabled based on the first temperature information. The second temperature sensor further includes a temperature sensor block configured to be activated according to the start-up signal and generate a temperature code corresponding to a result of measuring a temperature.

In yet another example embodiment, the sensor activation block is configured to generate the start-up signal which is enabled within a period of time when a master signal in the first temperature information switches from a lower level to a high level.

In yet another example embodiment, the second temperature sensor further includes a voting block configured to verify the temperature code and generate a verified temperature code. The second temperature sensor further includes a compensation block configured to adjust the verified temperature code based on the first temperature information to generate a compensated temperature code. The second temperature sensor further includes an internal control block configured to generate a control signal for controlling an operation of the second chip according to the compensated temperature code.

In yet another example embodiment, the voting block is configured to change a verification range for the temperature code according to a master signal in the first temperature information.

In yet another example embodiment, the compensation block is configured to add an offset code in the first temperature information to the verified temperature code.

In yet another example embodiment, the internal control block includes a mapping block configured to generate a frequency control signal mapped to the compensated temperature code, and an oscillator configured to generate the control signal having a frequency corresponding to the frequency control signal.

In yet another example embodiment, the second chip is a dynamic random access memory (DRAM) chip and the control signal is configured to determine a self-refresh interval of the DRAM chip.

In one example embodiment, a semiconductor chip includes a temperature sensor configured to be controlled based on temperature information generated according to at least one temperature measured by at least one first temperature sensor of a chip connected to the semiconductor chip. The semiconductor chip further includes a function block configured to change an internal operation of the semiconductor chip according to a control signal generated by the temperature sensor.

In yet another example embodiment, the temperature sensor includes a sensor activation block configured to generate a start-up signal, the start-up signal being enabled based on the temperature information. The temperature sensor further includes a temperature sensor block configured to be activated according to the start-up signal and generate a temperature code corresponding to a result of measuring a temperature.

In yet another example embodiment, the sensor activation block is configured to generate the start-up signal which is enabled within a period of time when a master signal in the temperature information switches from a low level to a high level.

In yet another example embodiment, the temperature sensor further includes a voting block configured to verify the temperature code and generate a verified temperature code, a compensation block configured to adjust the verified temperature code based on the temperature information to generate a compensated temperature code, and an internal control block configured to generate the control signal for controlling an operation of the semiconductor chip according to the compensated temperature code.

In yet another example embodiment, the voting block is configured to change a verification range for the temperature code based on a master signal in the temperature information.

In yet another example embodiment, the compensation block is configured to add an offset code in the temperature information to the verified temperature code.

In yet another example embodiment, the internal control block includes a mapping block configured to generate a frequency control signal mapped to the compensated temperature code and an oscillator configured to generate the control signal having a frequency corresponding to the frequency control signal.

In yet another example embodiment, the semiconductor chip is a DRAM chip and the control signal is configured to determine a self-refresh interval of the DRAM chip.

In one example embodiment, a semiconductor system includes a first chip configured to generate first temperature information of the first chip, the first temperature information being based on temperature measurements using a plurality of first temperature sensors. The semiconductor system further includes a second chip including a second temperature sensor configured to be controlled based on the first temperature information, the second temperature sensor being configured to measure a temperature and generate a temperature code corresponding to the temperature, wherein the first temperature information is offset information based on the temperature measurements.

In yet another example embodiment, the second temperature sensor is configured to change a time to start measuring a temperature of the second chip or an interval at which the temperature of the second chip is measured based on the first temperature information.

In yet another example embodiment, the second temperature sensor is configured to generate a control signal for controlling an internal operation of the second chip based on the first temperature information and the temperature code.

In yet another example embodiment, the second temperature sensor is configured to change a range in which a temperature of the second chip is measured according to the first temperature information.

In one example embodiment, a device includes a processor. The process is configured to generate first temperature information for controlling operation of the device based on second temperature information generated by another device, the other device being coupled to the device, generate a control signal based on the first and second temperature information, and adjust an internal operation of the device based on the control signal.

In yet another example embodiment, the processor is configured to generate the first temperature information by generating a start-up signal, the start-up signal being enabled based on the second temperature information, and generating a temperature code corresponding to the second temperature information.

In yet another example embodiment, the second temperature information includes a master signal, and the processor is configured to generate the start-up signal within a period of time when the master signal switches from a low level to a high level.

In yet another example embodiment, the processor is configured to generate the control signal by, generating a verified temperature code upon verifying the temperature code, adjusting the verified temperature code based on the second temperature information to generate a compensated temperature code, and generating the control signal based on the compensated temperature code.

In yet another example embodiment, the device is a dynamic random access memory (DRAM) chip, and the control signal is configured to determine a self-refresh interval of the DRAM chip.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF EXAMPLE EMBODIMENTS

Figure 1:
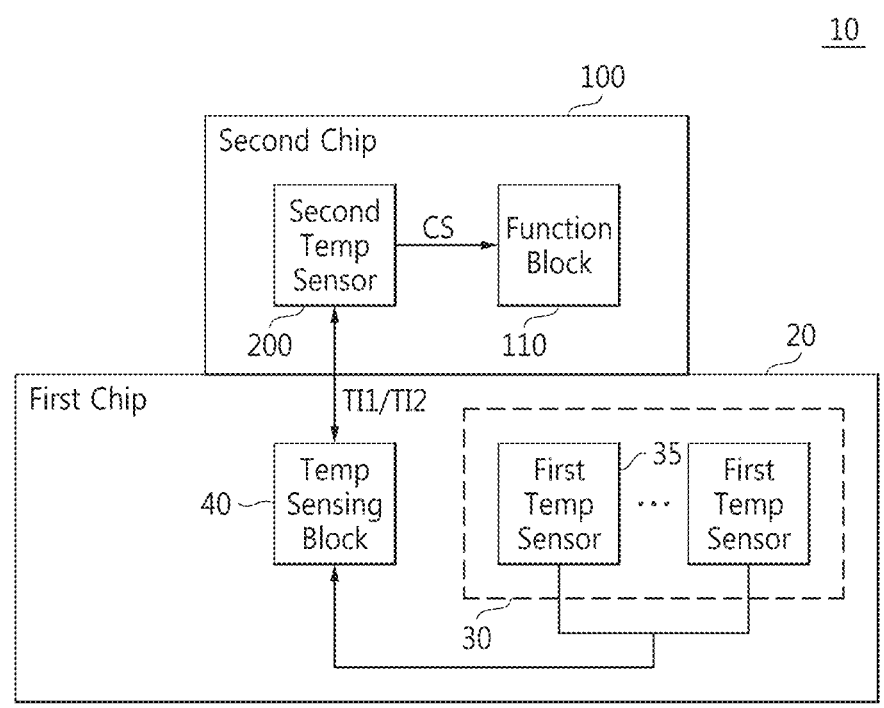
FIG. 1 is a schematic diagram of a memory system according to one example embodiment.

Inventive concepts now will be described more fully hereinafter with reference to the accompanying drawings, in which embodiments of the invention are shown. Inventive concepts may, however, be embodied in many different forms and should not be construed as limited to example embodiments set forth herein. Rather, example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing example embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic diagram of a memory system according to one example embodiment. The memory system 10 may include a first chip 20 and a second chip 100. The first chip 20 and the second chip 100 may be combined using package on package technology.

The first chip 20 may be implemented as an application processor, but inventive concepts are not restricted thereto. The first chip 20 may include a temperature sensor unit 30 and a temperature sensing block (temperature sensing information generator) 40. When the first chip 20 is implemented as an application processor, the first chip 20 may also include a central processing unit (CPU) (not shown), random access memory (RAM) (not shown), and an interface (not shown) in addition to the components 30 and 40.

The temperature sensor unit 30 may include at least one first temperature sensor 35. The at least one first temperature sensor 35 may be distributed across the first chip 20 and may transmit a temperature sensing result to the temperature sensing block 40 periodically or according to the control of the CPU.

The temperature sensing block 40 may generate first temperature information TI1 from the temperature sensing result of the at least one first temperature sensor 35. The first temperature information TI1 may include information for controlling the operation of the second chip 100 according to the temperature sensing result. The temperature sensing block 40 may receive second temperature information TI2 from the second chip 100 and may generate a control signal (not shown) for controlling the second chip 100 based on the second temperature information TI2.

The second chip 100 may be implemented as a semiconductor memory device such as dynamic RAM (DRAM), but inventive concepts are not restricted thereto. The second chip 100 may include a second temperature sensor 200 and a function block (controller) 110.

The second temperature sensor 200 may measure a temperature at a fixed (or alternatively, predetermined) interval (e.g., of 10 ms) and may generate a control signal CS for controlling the function block 110. The second temperature sensor 200 may measure a temperature of the second chip 100 according to a control (such as changing of a measurement time or interval) based on the first temperature information TI1 and may generate the control signal CS for controlling the function block 110 based on the first temperature information TI1 and a temperature code (TCODE in FIG. 3) corresponding to the measurement result. In addition, the second temperature sensor 200 may change a range of a temperature measurement according to the first temperature information TI1.

The second temperature sensor 200 may generate the second temperature information TI2 according to the measurement result and transmit the second temperature information TI2 to the temperature sensing block 40. The second temperature information TI2 may be a value representing the measured temperature.

The function block 110 may receive the control signal CS and may set or change an internal operation (e.g., a refresh operation) of the second chip 100 according to the control signal CS.

Figure 2:
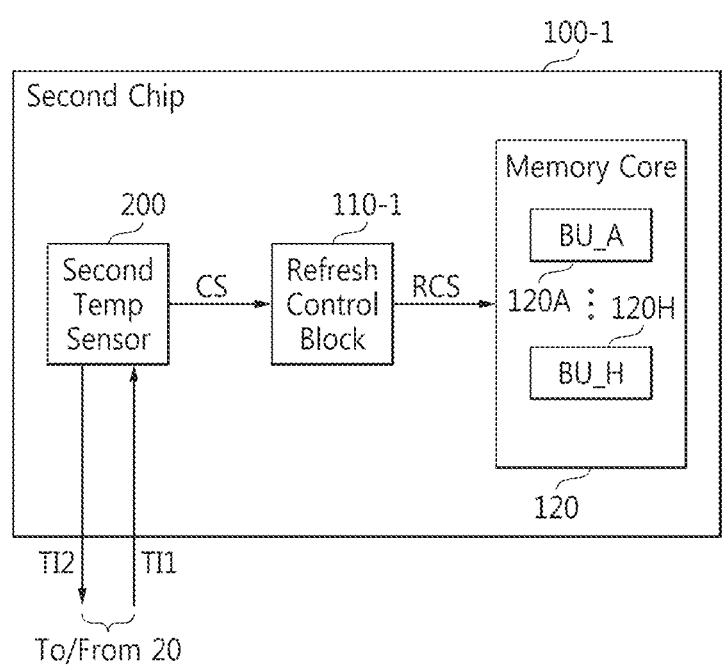
FIG. 2 is a block diagram of a second chip illustrated in FIG. 1 according to one example embodiment.

FIG. 2 is a block diagram of a second chip illustrated in FIG. 1, according to one example embodiment. Referring to FIGS. 1 and 2, the second chip 100-1 may be implemented as DRAM. The second chip 100-1 may include a refresh control block (refresh controller) 110-1, i.e., an example of the function block 110, and a memory core 120 besides the second temperature sensor 200.

The refresh control block 110-1 may control a refresh operation on memory cells included in the memory core 120 according to the control signal CS of the second temperature sensor 200. The control signal CS may have a desired period (and/or alternatively, predetermined) and the refresh control block 110-1 may detect the desired period of the control signal CS and generate a refresh control signal RCS corresponding to the desired period. In other words, the control signal CS may determine the self-refresh interval of the memory cells.

The memory core 120 may include a plurality of bank units BU_A through BU_H or 120A through 120H. Although the memory core 120 includes eight bank units 120A through 120H in example embodiments illustrated in FIG. 2, inventive concepts are not restricted thereto. The memory core 120 may include any number of bank units.

Each of the bank units 120A through 120H includes a plurality of memory cells (not shown) and peripheral circuits (not shown) for writing data to or reading data from the memory cells. Each of the memory cells includes a capacitor which stores charge corresponding to data. Since the charge stored in the capacitor tends to leak over time, the memory cells need to be refreshed periodically in order to increase the signal integrity (SI) of a semiconductor memory device. Therefore, the refresh operation is performed. In addition, the higher the temperature, the faster the charge stored in the capacitor leaks. Accordingly, a refresh interval needs to be shorter when the temperature is higher.

The peripheral circuits may perform a refresh operation on the memory cells at a self-refresh interval corresponding to the control signal CS according to the refresh control signal RCS. In other words, the control signal CS determines an interval at which the memory core 120 is refreshed and has a period corresponding to a short refresh interval when the temperatures measured by the second temperature sensor 200 increases.

Figure 3:
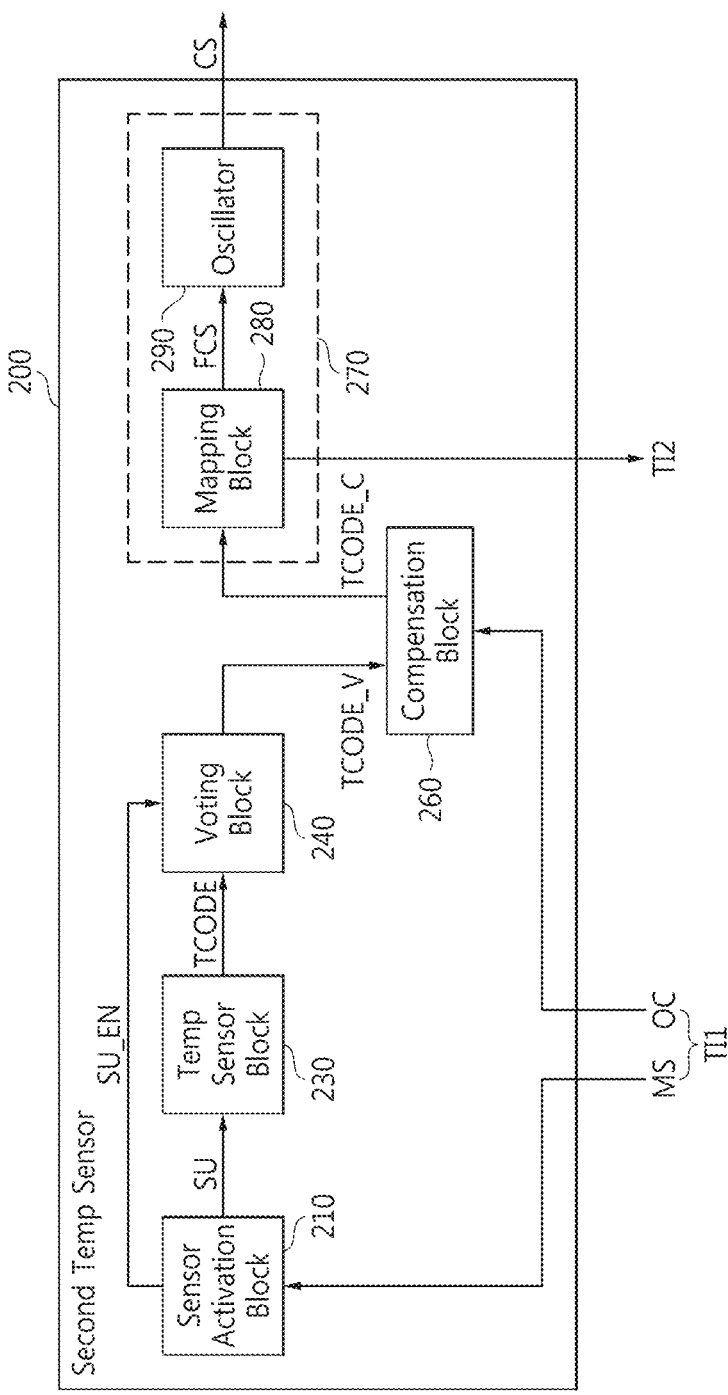
FIG. 3 is a detailed block diagram of a second temperature sensor illustrated in FIG. 2, according to one example embodiment.
Figure 4:
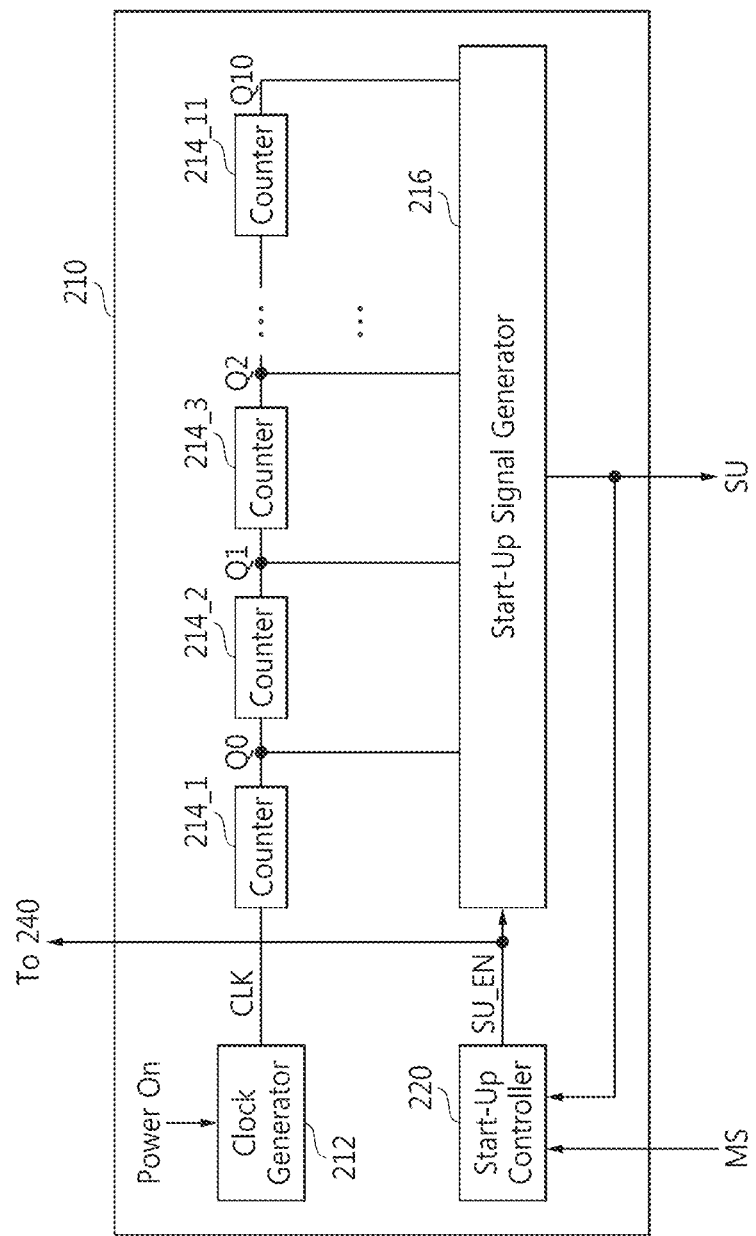
FIG. 4 is a detailed block diagram of a sensor activation block illustrated in FIG. 3, according to one example embodiment.
Figure 5:
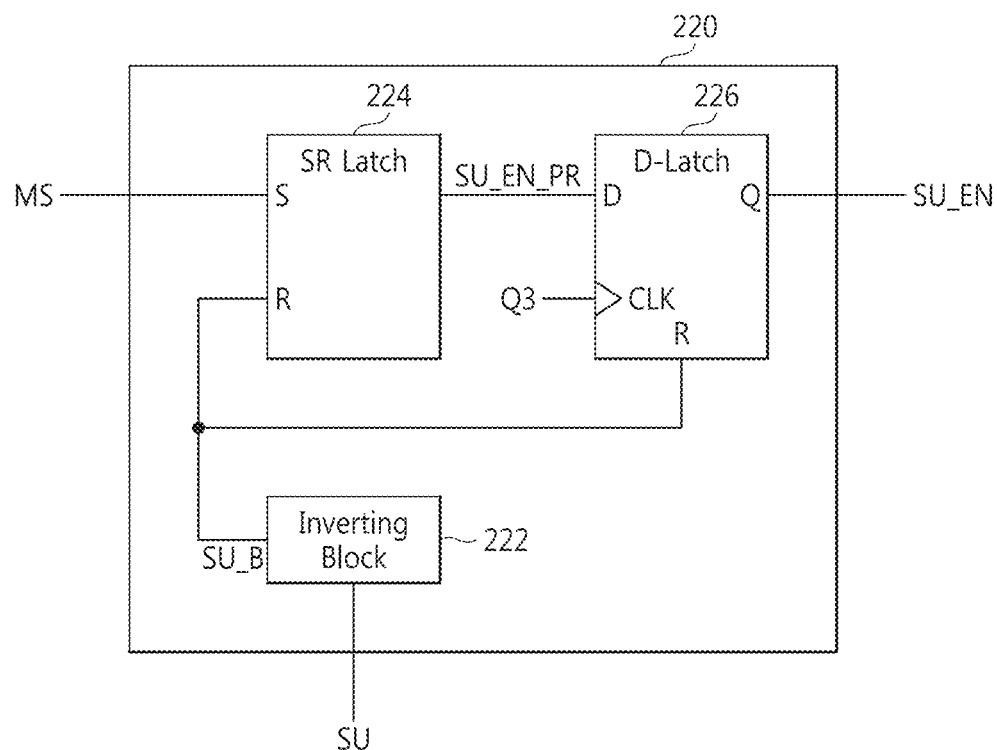
FIG. 5 is a detailed block diagram of a start-up controller illustrated in FIG. 4, according to one example embodiment.
Figure 6:
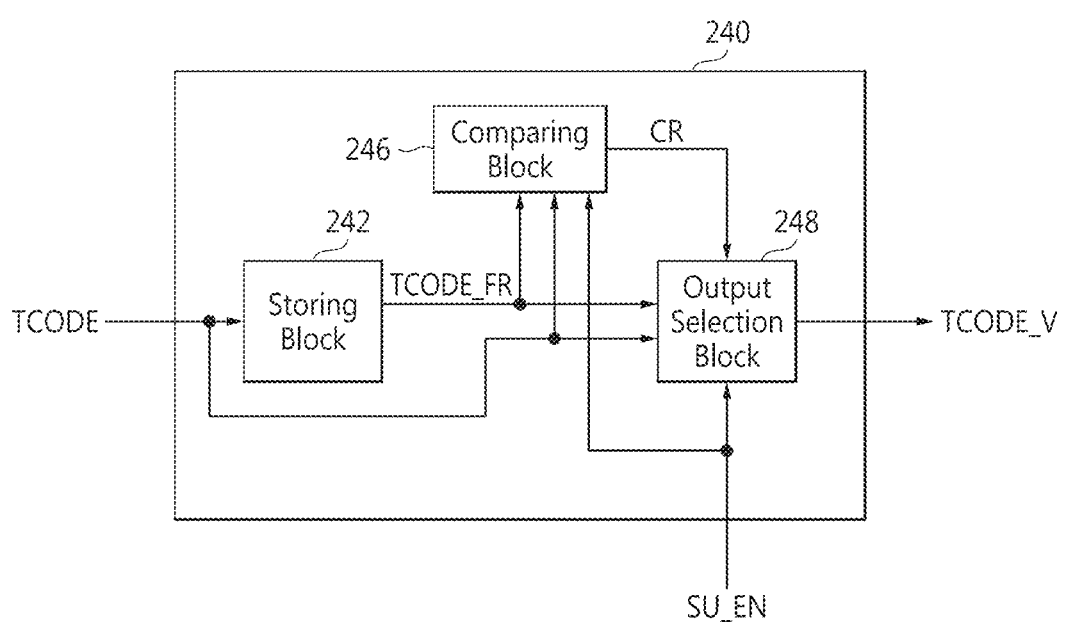
FIG. 6 is a detailed block diagram of a voting block illustrated in FIG. 3, according to one example embodiment.

FIG. 3 is a detailed block diagram of a second temperature sensor illustrated in FIG. 2, according to one example embodiment. FIG. 4 is a detailed block diagram of a sensor activation block illustrated in FIG. 3, according to one example embodiment. FIG. 5 is a detailed block diagram of a start-up controller illustrated in FIG. 4, according to one example embodiment. FIG. 6 is a detailed block diagram of a voting block illustrated in FIG. 3, according to one example embodiment. Referring to FIGS. 1 through 6, the second temperature sensor 200 may include a sensor activation block 210, a temperature sensor block 230, a voting block 240, a compensation block 260, and an internal control block 270.

The first temperature information TI1 may include a master signal MS and an offset code OC. The master signal MS may indicate a special situation (e.g., sudden change in a temperature of the first chip 20 or high temperature at a particular position in the first chip 20) has occurred based on a temperature measured by the at least one first temperature sensor 35. For instance, when a temperature change measured by the at least one first temperature sensor 35 is greater than a threshold value or when a difference between temperatures respectively measured by two sensor among the at least one first temperature sensor 35 is greater than the threshold value, the master signal MS may transit (switch) from a low level to a high level. The offset code OC may be a value corresponding to a difference between two temperatures having a greatest difference from each other among temperatures measured by the at least one first temperature sensor 35.

The sensor activation block (sensor activator) 210 may generate a start-up signal SU which is enabled according to the master signal MS in the first temperature information TI1. Here, enabling may refer to maintaining a high level signal or a low level signal. The sensor activation block 210 may generate the start-up signal SU that is enabled at a particular/desired (and/or alternatively predetermined) interval (e.g., of 10 ms).

Referring to FIG. 4, the sensor activation block 210 may include a clock generator 212, a plurality of counters 214_1 through 214_11, a start-up signal generator 216, and the start-up controller 220. The clock generator 212 may generate a clock signal CLK having a desired (and/or alternatively predetermined) period (e.g., 5 us) when the second chip 100 is powered up.

Each of the counters 214_1 through 214_11 may generate an output signal which transits (switches) to a different level (i.e., to a low level or a high level) whenever an edge (e.g., a falling edge) of an input signal is detected. For instance, a counter 214_1 may receive the clock signal CLK as an input signal and generate a count value Q0 which transits to a different level at a falling edge of the clock signal CLK. Accordingly, the count value Q0 has a period (e.g., 10 us) that is $2^1$ times of the period of the clock signal CLK. Similarly, the counters 214_2 through 214_11 may generate count values Q1 through Q10 as output signals. At this time, the count value Q3, i.e., the output signal of the counter 214_4 has a period (e.g., 80 us) that is $2^4$ times of the period of the clock signal CLK and, the count value Q10, i.e., the output signal of the counter 214_11 has a period (e.g., 10 ms) $2^{11}$ times of the period of the clock signal CLK. Although the number of the counters 214_1 through 214_11 is eleven in example embodiments illustrated in FIG. 4, inventive concepts are not restricted thereto.

The start-up signal generator 216 may receive the count values Q0 through Q10 respectively from the counters 214_1 through 214_11 and may combine at least one of the count values Q0 through Q10 to generate the start-up signal SU having a desired (and/or alternatively, predetermined) period and a desired (and/or alternatively, predetermined) enable time. For instance, the start-up signal generator 216 may combine the count values Q3 through Q10 to generate the start-up signal SU having a period of 10 ms and an enable time of 40 us. During the enable time, the start-up signal SU may be at a low level.

In addition, when a start-up enable signal SU_EN transits to a certain level (e.g., a high level), the start-up signal generator 216 may generate the start-up signal SU using at least one count value combined among the count values Q0 through Q10 except for a desired (and/or alternatively, predetermined) count value. For instance, when the start-up enable signal SU_EN transits to and remains at the high level while the start-up signal generator 216 is generating the start-up signal SU having a period of 10 ms and an enable time of 40 us by combining the count values Q3 through Q10, the start-up signal generator 216 may generate start-up signal SU using the count value Q3 ignoring the count values Q4 through Q10.

The start-up controller 220 may receive the master signal MS and the start-up signal SU and generate the start-up enable signal SU_EN. In detail, when the master signal MS requests the operation of the second temperature sensor 200 while the second temperature sensor 200 is performing a periodic operation for temperature measurement and generation of the control signal CS, the start-up controller 220 may generate the start-up enable signal SU_EN so that temperature measurement and generation of the control signal CS requested by the master signal MS is started after the periodic operation is completed.

Referring to FIG. 5, the start-up controller 220 may include an inverting block (inverter) 222, an SR latch 224, and a D-latch 226. The inverting block 222 may invert the start-up signal SU to generate an inverted start-up signal SU_B. The SR latch 224 may be any known or to be developed SR latch. The SR latch 224 may receive the master signal MS as a set input and the inverted start-up signal SU_B as a reset input and output a pre-start-up enable signal SU_EN_PR.

The D-latch 226 is any known or to be developed D-latch. The D-latch 226 may receive the pre-start-up enable signal SU_EN_PR as a data input and the count value Q3 as a clock input and output the start-up enable signal SU_EN. The D-latch 226 may also receive the inverted start-up signal SU_B as a reset input and may reset, for example, transit the start-up enable signal SU_EN to the low level. Here, it is assumed that the D-latch 226 delivers the pre-start-up enable signal SU_EN_PR to an output terminal at a rising edge of the count value Q3 and a falling edge of the inverted start-up signal SU_B to reset the output terminal, but inventive concepts are not restricted thereto.

In the operation of the start-up controller 220, when the master signal MS transits to the high level under the assumption that the inverted start-up signal SU_B is at the low level, the pre-start-up enable signal SU_EN_PR output from the SR latch 224 transits to the high level. Thereafter, when a rising edge occurs in the count value Q3, the start-up enable signal SU_EN may transit to the high level. The start-up signal generator 216 that has received the start-up enable signal SU_EN may generate the start-up signal SU at the low level during a desired (and/or alternatively, predetermined) enable time (e.g., 40 us). Since the start-up signal SU is at the low level, the inverted start-up signal SU_B is at the high level and the pre-start-up enable signal SU_EN_PR output from the SR latch 224 transits to the low level.

After the elapse of the enable time (e.g., 40 us), the start-up signal SU transits to the high level and the inverted start-up signal SU_B transits to the low level. Since a falling edge occurs in the inverted start-up signal SU_B, the start-up enable signal SU_EN output from the D-latch 226 is reset to the low level.

When the master signal MS transits to the high level under the assumption that the inverted start-up signal SU_B is at the high level, the pre-start-up enable signal SU_EN_PR output from the SR latch 224 does not transit to the high level. In other words, when the inverted start-up signal SU_B is at the high level, it means that the second temperature sensor 200 has already been performing a periodic operation for temperature measurement and generation of the control signal CS, and therefore, a new operation for temperature measurement and generation of the control signal CS requested by the master signal MS is not necessary. However, even in this case, the compensation block (compensator) 260 may perform an operation of adding the offset code OC to a verified temperature code TCODE_V.

For this reason, even when receiving the master signal MS requesting the operation of the second temperature sensor 200, the start-up controller 220 may generate the start-up enable signal SU_EN so that the periodic operation for temperature measurement and generation of the control signal CS does not overlap with the operation for temperature measurement and generation of the control signal CS requested by the master signal MS.

When the master signal MS generated at the high level by the first chip 20 is transmitted to the second chip 100, the second temperature sensor 200 measures a temperature and reflects (e.g., takes into account) the measured temperature in generation of the control signal CS. The reason that the count value Q3 is used as the clock input of the D-latch 226 is to allow the temperature measured by the second temperature sensor 200 to be reflected in the control signal CS within a target time.

For instance, when the target time is 200 us, the count value Q3 has a period of 80 us. Accordingly, taking process-voltage-temperature (PVT) variation and timing into account, even in the worst case scenario (i.e., when the master signal MS transits to the high level right after the expiration of the start-up enable signal SU_EN) the master signal MS can be reflected in the generation of the control signal CS within 80+40 us, i.e., 120 us when the count value Q3 is used.

When the start-up signal SU is enabled (e.g., when the start-up signal SU transits from the high level to the low level), the temperature sensor block (temperature sensor generator) 230 may measure a temperature and generate the temperature code TCODE corresponding to the measured temperature. The temperature code TCODE may be a digital value composed of eight bits which may change per one degree Celsius. For instance, when the measured temperature is 44 degrees Celsius, the temperature code TCODE may be "10000000" and when the measured temperature is 45 degrees Celsius, the temperature code TCODE may be "10000001".

The voting block (verification processor) 240 may verify the temperature code TCODE according to the start-up enable signal SU_EN and may generate the verified temperature code TCODE_V. Referring to FIG. 6, the voting block 240 may include a storing block (storage) 242, a comparing block (comparator) 246, and an output selection block (output selector) 248.

The storing block 242 may store the temperature code TCODE. When newly receiving the temperature code TCODE, the storing block 242 may output the temperature code TCODE that has already been stored as a previous temperature code TCODE_FR and may store the newly received temperature code TCODE.

The comparing block 246 may compare the previous temperature code TCODE_FR with the new temperature code TCODE and generate a comparison result CR. When it is assumed that the temperature code TCODE is composed of eight bits, the comparing block 246 may compare the previous temperature code TCODE_FR with the new temperature code TCODE bit by bit except for the least significant bit. When all seven bits match between the previous temperature code TCODE_FR and the new temperature code TCODE, the comparison result CR may be generated at a high level. When at least one bit does not match therebetween, the comparison result CR may be generated at a low level. In other words, only when a difference between the previous temperature code TCODE_FR and the new temperature code TCODE is within 1 bit, the comparison result CR may be generated at the high level.

The comparing block 246 may compare the previous temperature code TCODE_FR with the new temperature code TCODE and generate the comparison result CR according to the start-up enable signal SU_EN. When the start-up enable signal SU_EN is at the low level, the comparing block 246 may compare the previous temperature code TCODE_FR with the new temperature code TCODE bit by bit except for the least significant bit. When the start-up enable signal SU_EN is at the high level, the comparing block 246 may compare the previous temperature code TCODE_FR with the new temperature code TCODE bit by bit except for the least significant bit and at least one bit closest to the least significant bit, that is, the comparing block 246 may compare "k" bits in the previous temperature code TCODE_FR with corresponding "k" bits in the new temperature code TCODE, where "k" is an integer of at least 0 and at most 6.

When all "k" bits match between the previous temperature code TCODE_FR and the new temperature code TCODE, the comparison result CR may be generated at the high level. When at least one bit does not match therebetween, the comparison result CR may be generated at the low level. In other words, only when a difference between the previous temperature code TCODE_FR and the new temperature code TCODE is in a certain range (e.g., 3, 7, or 15 degrees Celsius), the comparison result CR may be generated at the high level. Here, the number of at least one bit may be predetermined during manufacturing of the second chip 100 or may vary with the start-up enable signal SU_EN.

The output selection block 248 may selectively output either the previous temperature code TCODE_FR or the new temperature code TCODE as the verified temperature code TCODE_V according to the comparison result CR. When the comparison result CR is at the high level, the output selection block 248 may output the new temperature code TCODE as the verified temperature code TCODE_V. When the comparison result CR is at the low level, the output selection block 248 may output the previous temperature code TCODE_FR as the verified temperature code TCODE_V.

Alternatively, the output selection block 248 may selectively output either the previous temperature code TCODE_FR or the new temperature code TCODE as the verified temperature code TCODE_V according to the comparison result CR and the start-up enable signal SU_EN. At this time, when the start-up enable signal SU_EN is at the low level, the output selection block 248 selects either the previous temperature code TCODE_FR or the new temperature code TCODE according to the comparison result CR. When the start-up enable signal SU_EN is at the high level, the output selection block 248 may output the new temperature code TCODE as the verified temperature code TCODE_V regardless of the comparison result CR.

An operation of the comparing block 246 changing a verification range for the temperature code TCODE according to the start-up enable signal SU_EN or an operation of the output selection block 248 changing the verification range to a bit of 0 ignoring the comparison result CR corresponding to a result of an operation of the comparing block 246 verifying the temperature code TCODE according to the start-up enable signal SU_EN may be selectively implemented. Consequently, when the start-up enable signal SU_EN is generated at the high level according to the master signal MS, rapid temperature change is highly likely to be occurring, and therefore, the voting block 240 alleviates the verification range for the temperature code TCODE.

The compensation block 260 may generate a compensated temperature code TCODE_C by adding the offset code OC to the verified temperature code TCODE_V. The offset code OC corresponds to a difference between two temperatures having a greatest difference from each other among temperatures measured by the at least one first temperature sensor 35. Accordingly, the offset code OC is added to the verified temperature code TCODE_V because there is a possibility that the verified temperature code TCODE_V is the lowest one among the temperatures measured by the at least one first temperature sensor 35. In other words, the worst case where the verified temperature code TCODE_V is the lowest one among the temperatures measured by the at least one first temperature sensor 35 is presumed, so that the second chip 100 performs a refresh operation at an optimal refresh interval in order to prevent loss of data stored in the second chip 100.

The internal control block (internal controller) 270 may include a mapping block (mapper) 280 and an oscillator 290. The internal control block 270 may generate the control signal CS for controlling an operation (e.g., generation of the refresh control signal RCS) of the function block 110 or 110-1 according to the compensated temperature code TCODE_C.

The mapping block 280 may receive the compensated temperature code TCODE_C and may generate a frequency control signal FCS corresponding to the compensated temperature code TCODE_C. The mapping block 280 may include a mapping table in which a certain temperature is mapped to the frequency control signal FCS that allows the oscillator 290 to generate the control signal CS corresponding to a refresh interval necessary at the certain temperature, so that the mapping block 280 may retrieve and output the frequency control signal FCS corresponding to the compensated temperature code TCODE_C when receiving the compensated temperature code TCODE_C. The frequency control signal FCS may be a digital code and may accurately control the frequency (or period) of the control signal CS generated by the oscillator 290.

The mapping block 280 may also generate the second temperature information TI2 based on the compensated temperature code TCODE_C. For instance, the mapping block 280 may divide a range of 0 to 80 degrees Celsius into eight temperature sections and may generate the second temperature information TI2 of three bits (e.g., 000) indicating a temperature section corresponding to the compensated temperature code TCODE_C (e.g., 5 degrees Celsius).

The oscillator 290 may generate the control signal CS having the frequency (or period) corresponding to the frequency control signal FCS to control an operation of the refresh control block (refresh controller) 110-1 generating the refresh control signal RCS.

Figure 7:
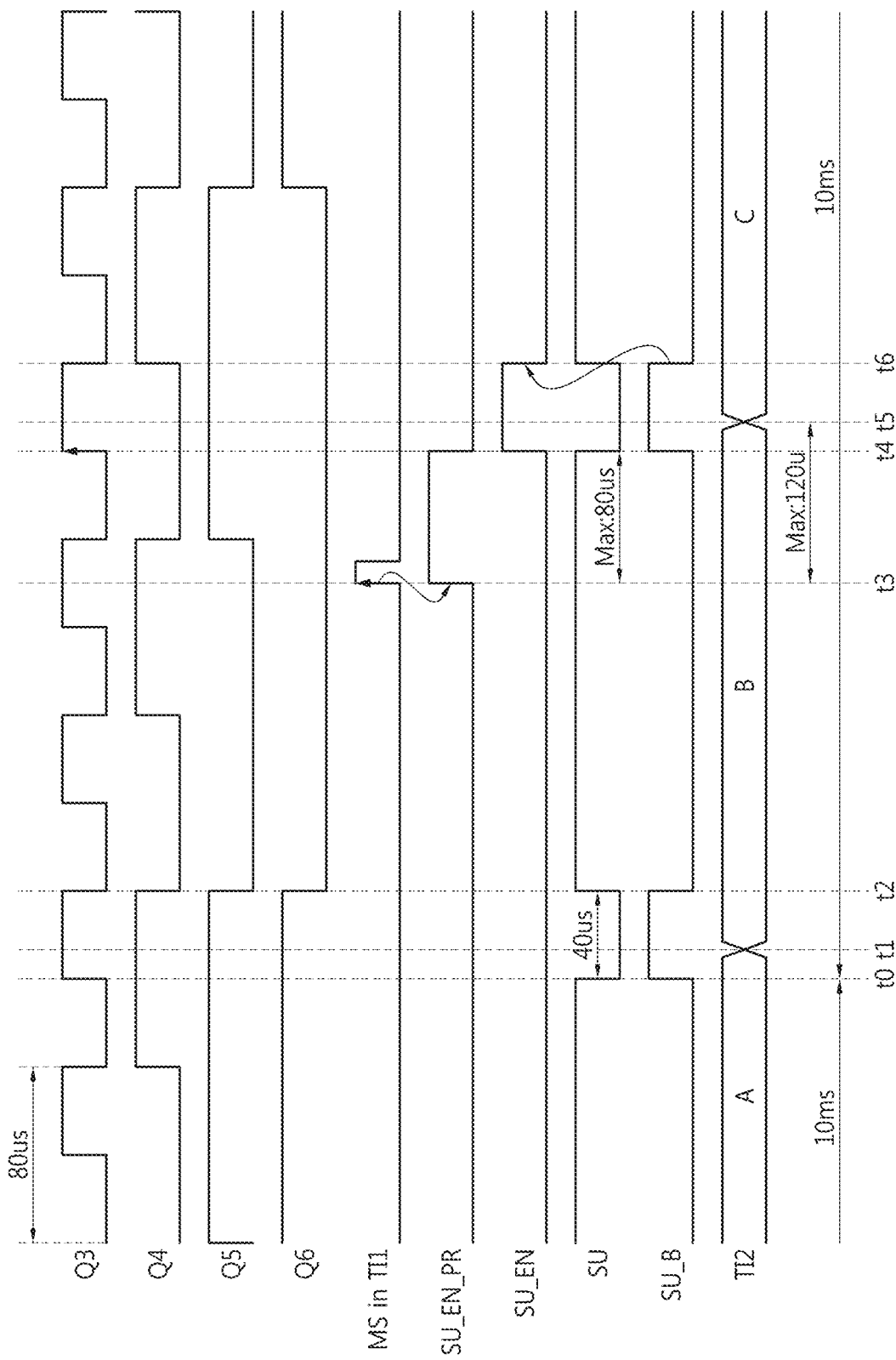
FIG. 7 is a timing chart showing the operation of the second temperature sensor illustrated in FIG. 2, according to one example embodiment.

FIG. 7 is a timing chart showing the operation of a second temperature sensor illustrated in FIG. 2, according to one example embodiment. Referring to FIGS. 1 through 7, when it is assumed that the clock signal CLK has a period of 5 us, the count values Q3 through Q6 have periods of 80, 160, 320 and 640 us, respectively.

As described above with reference to FIG. 4, the start-up signal SU is repeatedly enabled at an interval of 10 ms and has an enable time of 40 us from a time point t0 to a time point t2. The second temperature information TI2 corresponding to a second value B is generated at a time point t1 a little delay time after the start-up signal SU is enabled at the time point t0. The delay time is assumed to be a maximum of 40 us.

A periodic operation of the second temperature sensor 200 for temperature measurement and generation of the control signal CS is completed at the time point t2. When the master signal MS in the first temperature information TI1 transits to the high level at a time point t3, the pre-start-up enable signal SU_EN_PR output from the SR latch 224 transits to the high level.

When a rising edge of the count value Q3 occurs at a time point t4, the start-up enable signal SU_EN may transit to the high level. Upon receiving the start-up enable signal SU_EN, the start-up signal generator 216 may generate the start-up signal SU which is at the low level during a desired (and/or alternatively, predetermined) enable time of 40 us. As the start-up signal SU is at the low level, the inverted start-up signal SU_B is at the high level and the pre-start-up enable signal SU_EN_PR output from the SR latch 224 transits to the low level. In other words, a periodic operation of the second temperature sensor 200 for temperature measurement and generation of the control signal CS commences within a maximum of 80 us (i.e., the period of the count value Q3) from the time point t3.

The delay time after the start-up signal SU is enabled at the time point t4, the second temperature information TI2 corresponding to a third value C is generated at a time point t5 within a maximum of 120 us (i.e., the period of the count value Q3 plus the delay time) from the time point t3. At this time, as the start-up enable signal SU_EN is at the high level, the voting block 240 may change a verification range for the temperature code TCODE.

After the elapse of the enable time of 40 us, the start-up signal SU transits to the high level and the inverted start-up signal SU_B transits to the low level at a time point t6. Since a falling edge of the inverted start-up signal SU_B occurs at the time point t6, the start-up enable signal SU_EN output from the D-latch 226 is reset to the low level.

At the time point t6, another periodic operation of the second temperature sensor 200 for temperature measurement and generation of the control signal CS may be performed at a time point when 10 ms elapses from the time point t0.

Consequently, in example embodiments where the temperature of the first chip 20 rapidly changes according to the first temperature information TI1 generated by the first chip 20 in the semiconductor system 10, the second temperature sensor 200 may immediately re-measure a temperature and change an internal operation of the second chip 100 according to the measured temperature, thereby preventing an error (data loss in memory cells) from occurring during an operation.

In addition, when the second temperature sensor 200 measures a temperature according to the first temperature information TI1, a verification range for the temperature code TCODE may be changed according to the first temperature information TI1 so that the temperature may be accurately measured. Also, the verified temperature code TCODE_V is compensated for according to the first temperature information TI1, allowing a refresh operation to be performed at an optimal refresh interval, so that loss of data in the second chip 100 is prevented.

Figure 8:
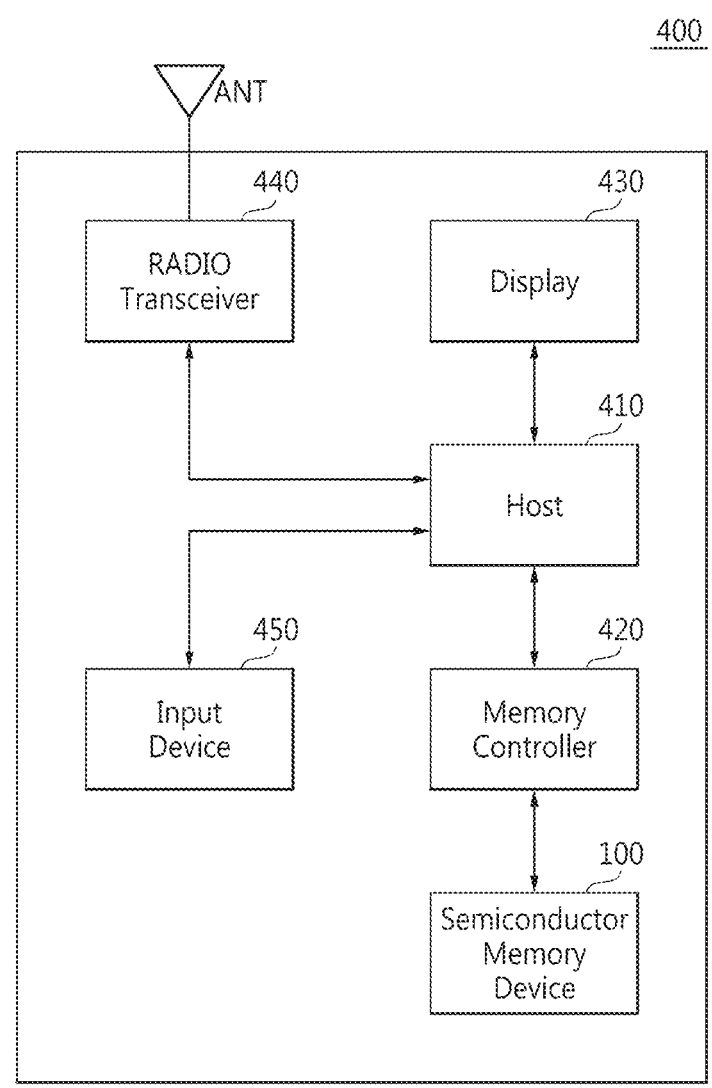
FIG. 8 is a block diagram of a computer system including a semiconductor system illustrated in FIG. 1 according to one example embodiment.

FIG. 8 is a block diagram of a computer system including a semiconductor system illustrated in FIG. 1, according to one example embodiment. Referring to FIGS. 1 and 8, a computer system 400 may be implemented as a cellular phone, a smart phone, a tablet personal computer (PC), a personal digital assistant (PDA) or a radio communication system.

The computer system 400 includes the semiconductor memory device 100 and a memory controller 420 controlling the operations of the semiconductor memory device 100. The memory controller 420 may control the data access operations, e.g., a write operation or a read operation, of the semiconductor memory device 100 according to the control of a host 410.

The data in the semiconductor memory device 100 may be displayed through a display 430 according to the control of the host 410 and/or the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 430. The memory controller 420 may program the signals processed by the host 410 to the semiconductor memory device 100.

The radio transceiver 440 may also convert signals output from the host 410 into radio signals and outputs the radio signals to an external device through the antenna ANT.

An input device 450 enables control signals for controlling the operation of the host 410 or data to be processed by the host 410 to be input to the computer system 400. The input device 450 may be implemented by a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be implemented as a part of the host 410 or as a separate chip.

The semiconductor memory device 100 may be the second chip 100 illustrated in FIG. 1, and some among the other elements 410, 420, 430, 440 and 450 may be the first chip 20 illustrated in FIG. 1.

Figure 9:
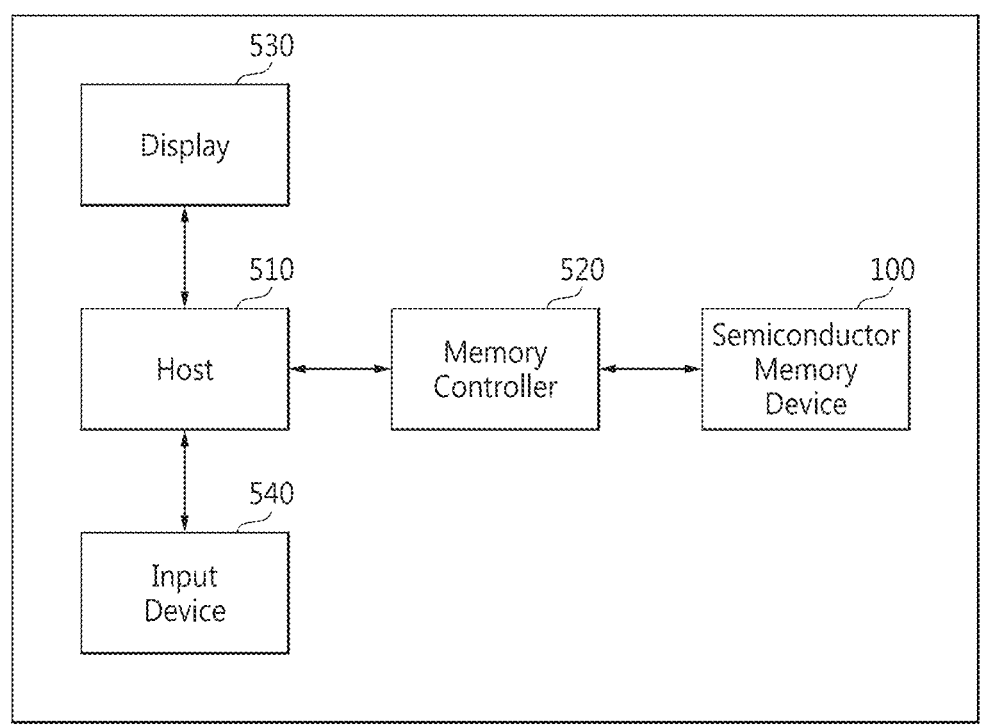
FIG. 9 is a block diagram of a computer system including a semiconductor system illustrated in FIG. 1 according to one example embodiment.

FIG. 9 is a block diagram of a computer system including a semiconductor system illustrated in FIG. 1, according to one example embodiment. A computer system 500 may be implemented as a personal computer (PC), a tablet PC, a netbook, an e-reader, a personal digital assistant (PDA), a portable multimedia player (PMP), an MP3 player, or an MP4 player.

The computer system 500 includes a host 510, a semiconductor memory device 100, a memory controller 520 controlling the data processing operations of the semiconductor memory device 100, a display 530 and an input device 540.

The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520.

According to example embodiments, the memory controller 520, which may control the operations of the semiconductor memory device 100, may be implemented as a part of the host 510 or as a separate chip.

The semiconductor memory device 100 may be the second chip 100 illustrated in FIG. 1, and one or more of the other elements 510, 520, 530 and 540 may be the first chip 20 illustrated in FIG. 1.

Figure 10:
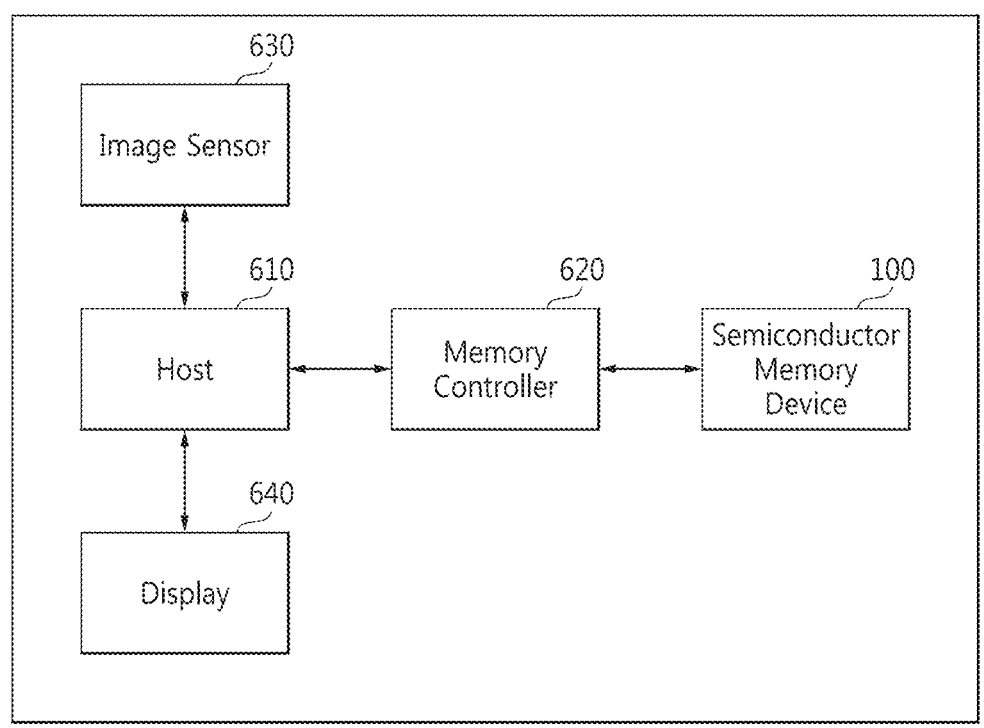
FIG. 10 is a block diagram of a computer system including a semiconductor system illustrated in FIG. 1 according to one example embodiment.

FIG. 10 is a block diagram of a computer system including a semiconductor system illustrated in FIG. 1 according to one example embodiment. A computer system 600 may be implemented as an image processing device like a digital camera, a cellular phone equipped with a digital camera, or a smart phone equipped with a digital camera.

The computer system 600 includes a host 610, a semiconductor memory device 100 and a memory controller 620 controlling the data processing operations, such as a write operation or a read operation, of the semiconductor memory device 100. The computer system 600 further includes an image sensor 630 and a display 640.

The image sensor 630 included in the computer system 600, converts optical images into digital signals and outputs the digital signals to the host 610 or the memory controller 620. The digital signals may be controlled by the host 610 to be displayed through the display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be implemented as a part of the host 610 or as a separate chip.

The semiconductor memory device 100 may be the second chip 100 illustrated in FIG. 1, and one or more of the other elements 610, 620, 630 and 640 may be the first chip 20 illustrated in FIG. 1.

Figure 11:
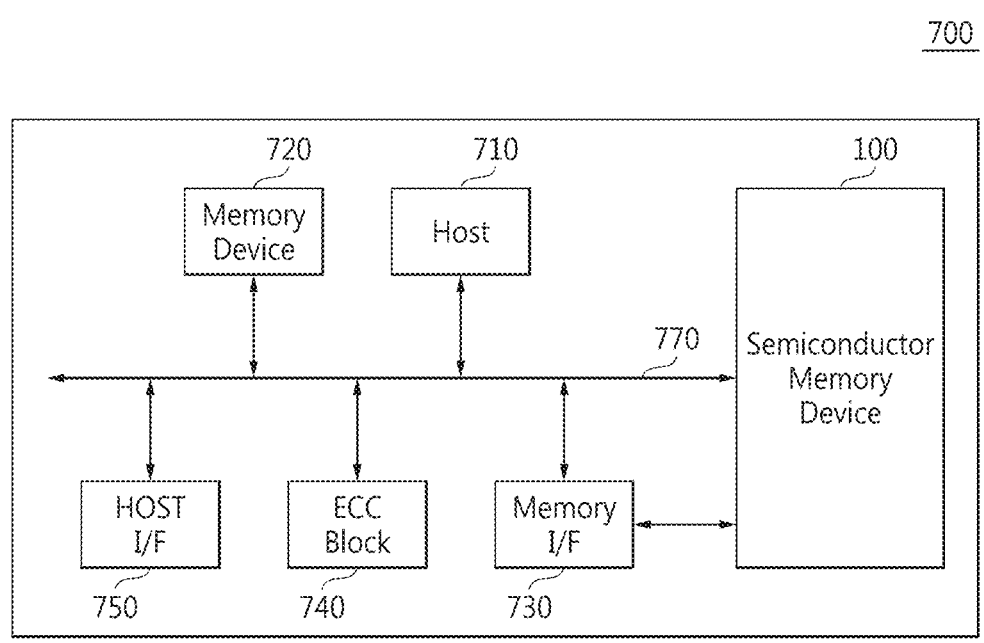
FIG. 11 is a block diagram of a computer system including a semiconductor system illustrated in FIG. 1 according to one example embodiment.

FIG. 11 is a block diagram of a computer system including a semiconductor system illustrated in FIG. 1 according to one example embodiment. A computer system 700 includes a semiconductor memory device 100 and a host 710 controlling the operations of the semiconductor memory device 100.

The computer system 700 also includes a system memory 720, a memory interface 730, an error correction code (ECC) block 740, and a host interface 750.

The system memory 720 may be used an operation memory of the host 710. The system memory 720 may be implemented by a non-volatile memory like read-only memory (ROM) or a volatile memory like static random access memory (SRAM).

The host 710 connected with the computer system 700 may perform data communication with the semiconductor memory device 100 through the memory interface 730 and the host interface 750.

The ECC block 740 is controlled by the host 710 to detect an error bit included in data output from the semiconductor memory device 100 through the memory interface 730, correct the error bit, and transmit the error-corrected data to the host 710 through the host interface 750. The host 710 may control data communication among the memory interface 730, the ECC block 740, the host interface 750, and the system memory 720 through a bus 770. The computer system 700 may be implemented as a flash memory drive, a USB memory drive, an IC-USB memory drive, or a memory stick.

The semiconductor memory device 100 may be the second chip 100 illustrated in FIG. 1, and one or more of the other elements 710, 720, 730, 740 and 750 may be the first chip 20 illustrated in FIG. 1.

Figure 12:
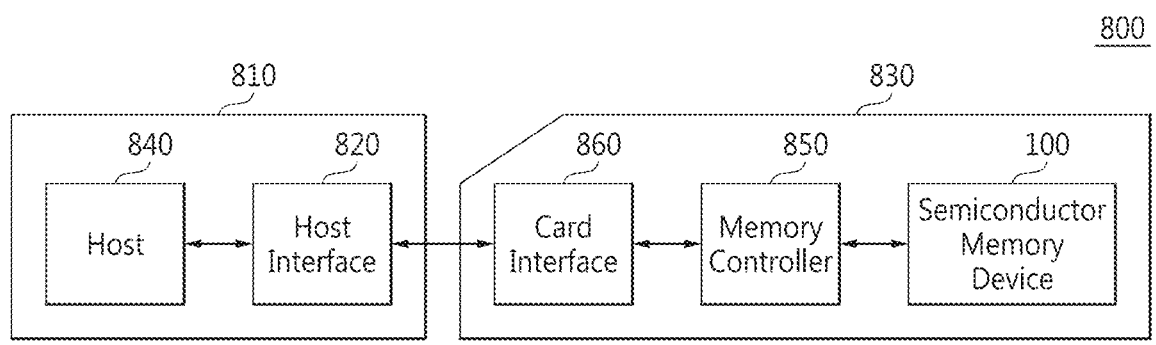
FIG. 12 is a block diagram of a computer system including a semiconductor system illustrated in FIG. 1 according to one example embodiment.

FIG. 12 is a block diagram of a computer system including a semiconductor system illustrated in FIG. 1 according to one example embodiment. A computer system 800 may be implemented as a host computer 810 and a memory card or a smart card. The computer system 800 includes the host computer 810 and the memory card 830.

The host computer 810 includes a host 840 and a host interface 820. The memory card 830 includes a semiconductor memory device 100, a memory controller 850, and a card interface 860. The memory controller 850 may control data exchange between the semiconductor memory device 100 and the card interface 860.

According to example embodiments, the card interface 860 may be a secure digital (SD) card interface or a multi-media card (MMC) interface, but inventive concepts are not restricted thereto.

When the memory card 830 is installed into the host computer 810, the card interface 860 may interface the host 840 and the memory controller 850 for data exchange according to a protocol of the host 840. The card interface 860 may support a universal serial bus (USB) protocol and an interchip (IC)-USB protocol. Here, the card interface 860 may indicate a hardware supporting a protocol used by the host computer 810, a software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to the control of the host 840.

The semiconductor memory device 100 may be the second chip 100 illustrated in FIG. 1, and one or more of the other elements 850 and 860 may be the first chip 20 illustrated in FIG. 1.

Figure 13:
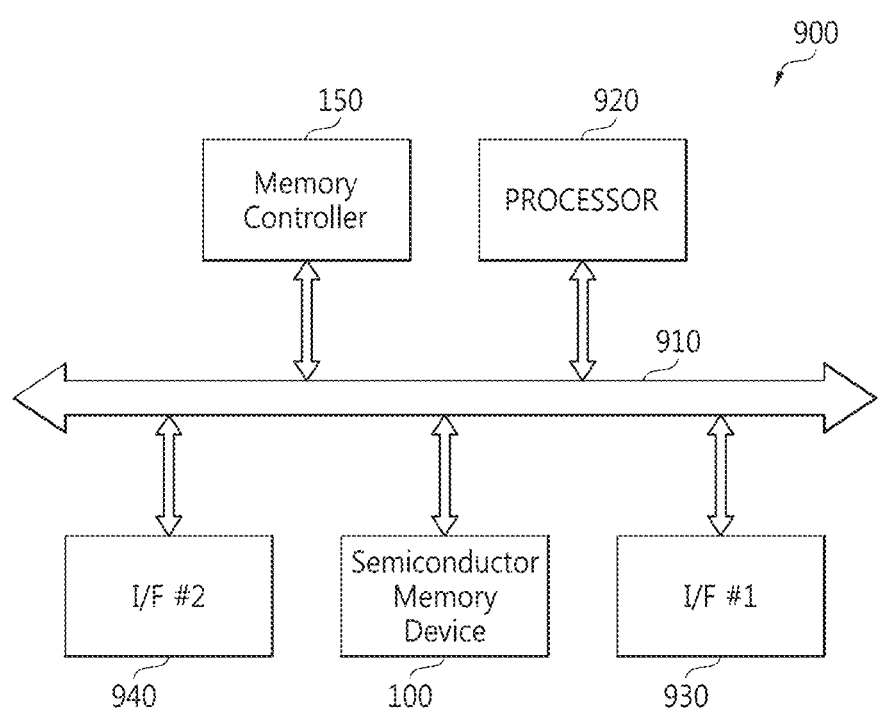
FIG. 13 is a block diagram of a computer system including a semiconductor system 10 illustrated in FIG. 1 according to one example embodiment.

FIG. 13 is a block diagram of a computer system including a semiconductor system illustrated in FIG. 1 according to one example embodiment. A computer system 900 may include a semiconductor memory device 100, a memory controller 150, a processor 920, a first interface 930 and a second interface 940 which are connected to a data bus 910.

According to example embodiments, the computer system 900 may include a portable device such as a mobile phone, MP3 (MPECG Audio Layer-3) player, or MP4 (MPECG Audio Layer-4) player, a personal digital assistant (PDA), or a portable media player (PMP).

According to example embodiments, the computer system 900 may include a data processing system such as a personal computer (PC), a notebook-sized personal computer or a laptop computer.

According to example embodiments, the computer system 900 may include a memory card such as a secure digital (SD) card or a multimedia card (MMC).

According to some embodiments, the computer system 900 may include a smart card or a solid state drive (SSD).

The semiconductor memory device 100, the memory controller 150 and the processor 920 may be implemented as one chip, for example, a system on chip (SoC) or as separate devices.

According to example embodiments, the processor 920 may process data input through the first interface 930 and write the data in the semiconductor memory device 100.

According to example embodiments, the processor 920 may read data from the semiconductor memory device 100 and output the data through the first interface 930. In this case, the first interface 930 may be an input/output device.

The second interface 940 may be a wireless interface for wireless communication.

According to example embodiments, the second interface 940 may be implemented by software or firmware.

The semiconductor memory device 100 may be the second chip 100 illustrated in FIG. 1, and one or more of the other elements 150, 920, 930 and 940 may be the first chip 20 illustrated in FIG. 1.

Figure 14:
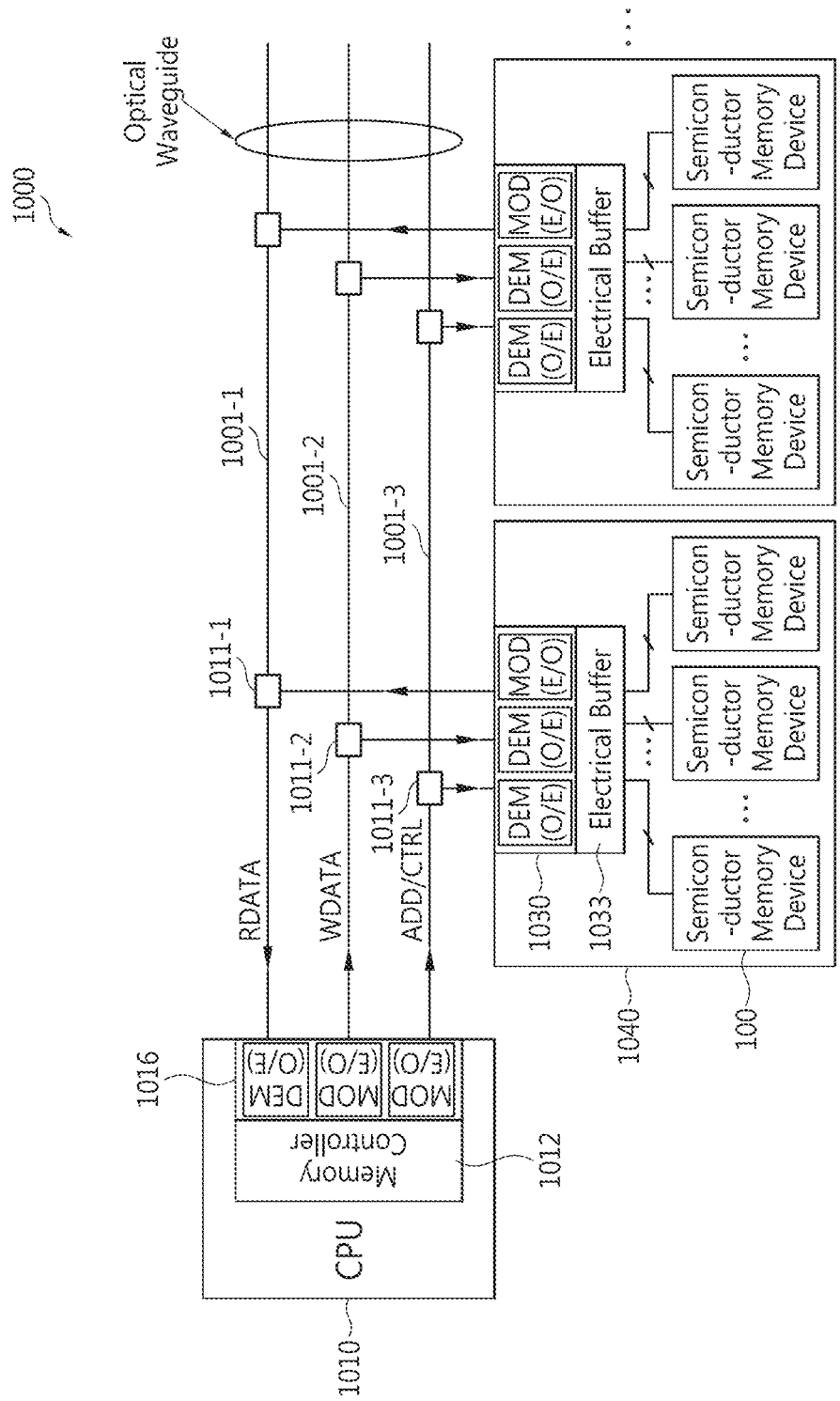
FIG. 14 is a block diagram of a data processing system including a semiconductor system illustrated in FIG. 1 according to one example embodiment.

FIG. 14 is a block diagram of a data processing system including a semiconductor system as illustrated in FIG. 1 according to one example embodiment. In FIG. 14, MOD (E/O) denotes an optical modulator used as an E/O converter which converts electrical signal to optical signal, and DEM (O/E) denotes an optical demodulator used as an O/E converter which converts optical signal to electrical signal. Referring to FIGS. 1 and 14, a data processing system 1000 includes a central processing unit (CPU) 1010, a plurality of data buses 1001-1, 1001-2, and 1001-3, and a plurality of memory modules 1040.

Each of the memory modules 1040 may transmit and receive optical signals through a plurality of couplers 1011-1, 1011-2, and 1011-3 respectively connected to the data buses 1001-1 through 1001-3. According to example embodiments, each of the couplers 1011-1 through 1011-3 may be implemented by an electrical coupler or an optical coupler.

The CPU 1010 includes a first optical transceiver 1016, which includes at least one optical modulator MOD(E/O) and at least one optical demodulator DEM(O/E), and a memory controller 1012. The optical demodulator DEM(O/E) is used as an O/E converter. The memory controller 1012 is controlled by the CPU 1010 to control the operations, e.g., the transmitting operation and the receiving operation, of the first optical transceiver 1016.

For instance, during a write operation, a first optical modulator MOD(E/O) of the first optical transceiver 1016 generates a modulated optical signal ADD/CTRL from addresses and control signals and transmits the optical signal ADD/CTRL to the data bus 1001-3 in compliance with the memory controller 1012.

After the first optical transceiver 1016 transmits the optical signal ADD/CTRL to the data bus 1001-3, a second optical modulator MOD(E/O) of the first optical transceiver 1016 generates modulated optical write data WDATA and transmits the optical write data WDATA to the data bus 1001-2.

Each of the memory modules 1040 includes a second optical transceiver 1030 and a plurality of memory devices 100. Each memory module 1040 may be implemented by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or an optical single in-line memory module (SIMM).

Referring to FIG. 14, an optical demodulator DEM(O/E) included in the second optical transceiver 1030 demodulates the optical write data WDATA received through the data bus 1001-2 and transmits a demodulated electrical signal to at least one of the memory devices 100.

Each memory module 1040 may also include an electrical buffer 1033 which buffers an electrical signal output from an optical demodulator DEM(O/E). For instance, the electrical buffer 1033 may buffer a demodulated electrical signal and transmit the buffered electrical signal to at least one of the memory devices 100.

During a read operation, an electrical signal output from the memory device 100 is modulated into optical read data RDATA by an optical modulator MOD(E/O) included in the second optical transceiver 1030. The optical read data RDATA is transmitted to a first optical demodulator DEM (O/E) included in the CPU 1010 through the data bus 1001-1. The first optical demodulator DEM(O/E) demodulates the optical read data RDATA and transmits a demodulated electrical signal to the memory controller 1012.

The semiconductor memory device 100 may be the second chip 100 illustrated in FIG. 1, and the CPU 1010 may be the first chip 20 illustrated in FIG. 1.

Figure 15:
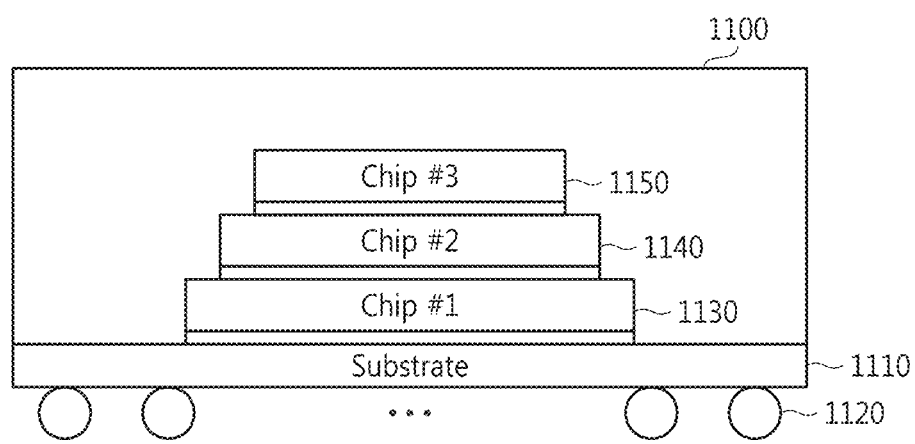
FIG. 15 is a schematic conceptual diagram of a multi-chip package including a semiconductor system illustrated in FIG. 1, according to one example embodiment.

FIG. 15 is a schematic conceptual diagram of a multi-chip package including a semiconductor system illustrated in FIG. 1, according to one example embodiment. Referring to FIGS. 1 and 15, a multi-chip package 1100 may include a plurality of semiconductor devices, i.e., first through third chips 1130, 1140, and 1150 which are sequentially stacked on a package substrate 1110. Each of the semiconductor devices 1130 through 1150 may include a semiconductor memory device 100. A memory controller (not shown) for controlling the operations of the semiconductor devices 1130 through 1150 may be included within at least one of the semiconductor devices 1130 through 1150 or may be implemented on the package substrate 1110. A through-silicon via (TSV) (not shown), a bonding wire (not shown), a bump (not shown), or a solder ball 1120 may be used to electrically connect the semiconductor devices 1130 through 1150 with one other.

For example, the first semiconductor device 1130 may be a logic die including an input/output interface and a memory controller and the second and third semiconductor devices 1140 and 1150 may be a die, on which a plurality of memory devices are stacked, and may include a memory cell array. At this time, a memory device of the second semiconductor device 1140 and a memory device of the third semiconductor device 1150 may be the same or different types of memory.

Alternatively, each of the first through third semiconductor devices 1130 through 1150 may include a memory controller. At this time, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory device may be positioned in the second or third semiconductor device 1140 or 1150. The memory device may be connected with the memory controller through a TSV.

The multi-chip package 1100 may be implemented using hybrid memory cube (HMC) in which a memory controller and a memory cell array die are stacked. When the HMC is used, the performance of memory devices increases due to the increase of bandwidth and the area of the memory devices is minimized. As a result, power consumption and manufacturing cost can be reduced.

At least one of the semiconductor devices 1130 through 1150 may be the second chip 100 illustrated in FIG. 1, and another one of the semiconductor devices 1130 through 1150 may be the first chip 20 illustrated in FIG. 1.

Figure 16:
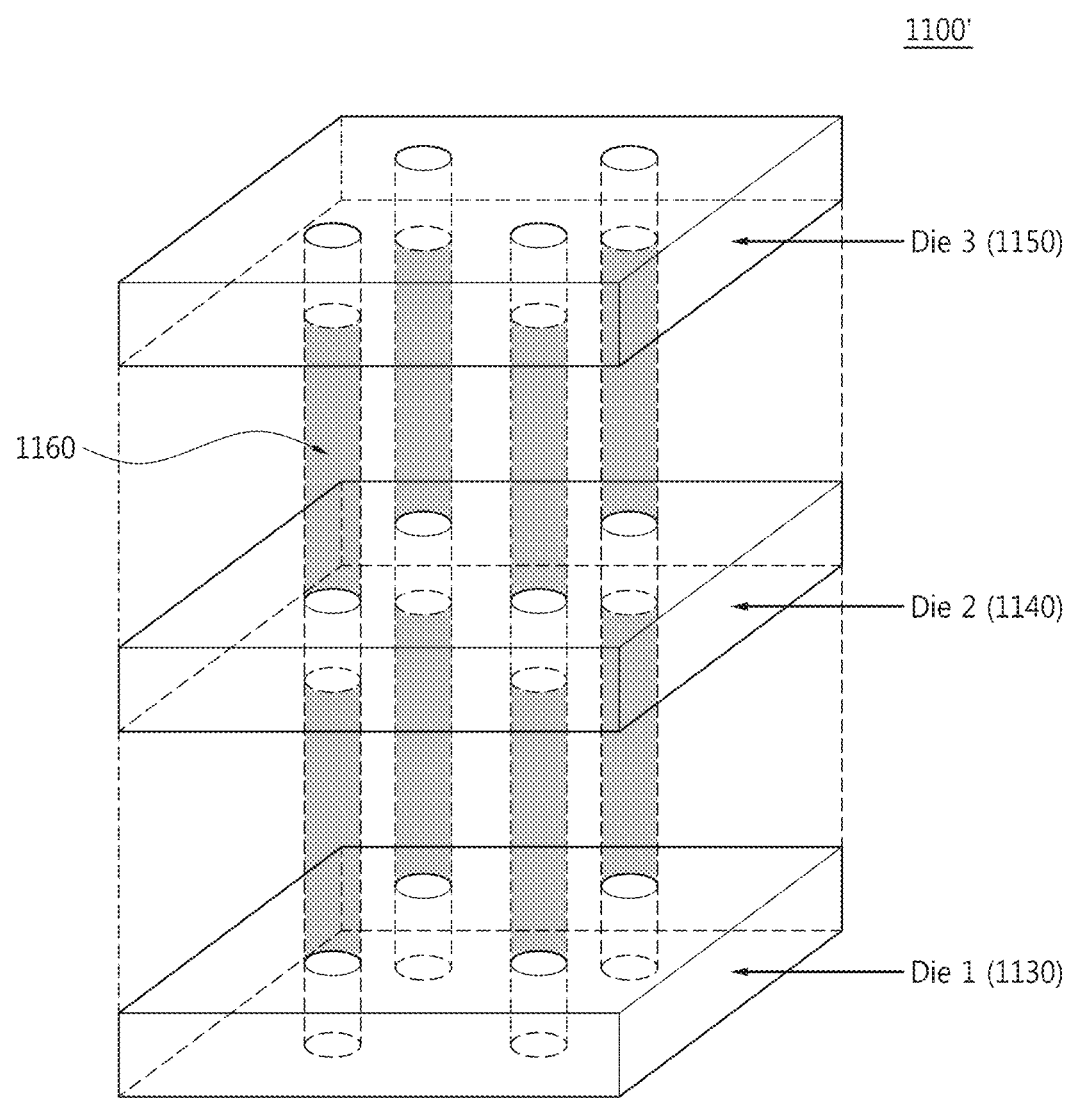
FIG. 16 is a three-dimensional conceptual diagram of a multi-chip package illustrated in FIG. 15, according to one example embodiment.

FIG. 16 is a three-dimensional conceptual diagram of an example of a multi-chip package illustrated in FIG. 15, according to one example embodiment. Referring to FIGS. 1, 15, and 16, a multi-chip package 1100' includes a plurality of the dies 1130 through 1150 connected with one another through TSVs 1160 in a stack structure. Each of the dies 1130 through 1150 may include a plurality of circuit blocks (not shown) and a periphery circuit to realize the functions of the semiconductor memory device 100. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate. The silicon substrate surrounds the TSVs 1160. An insulating region (not shown) may be disposed between the TSVs 1160 and the silicon substrate.

As described above, according to example embodiments of inventive concepts, a second temperature sensor immediately re-measures a temperature and changes an internal operation of a second chip according to the measured temperature in a situation like the temperature of a first chip rapidly changes according to first temperature information generated by the first chip in a semiconductor system, thereby preventing an error (data loss in memory cells) from occurring during an operation.

In addition, when the second temperature sensor measures a temperature according to the first temperature information, a verification range for a temperature code is changed according to the first temperature information so that the temperature can be accurately measured. Also, a verified temperature code is compensated for according to the first temperature information, allowing a refresh operation to be performed at an optimal refresh interval, so that loss of data in the second chip is prevented.

Inventive concepts may also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

The various blocks described above with reference to FIGS. 1-16 may be implemented as computer-programs, which when executed by a processor, cause the processor to perform the functions of the respective one of the blocks. For example, the functionalities of the blocks shown in FIG. 3, may be embedded within a computer-executable set of instructions, which when executed by a processor, perform the functionalities described above for each of the blocks shown in FIG. 3. The same may be applied to the blocks described with regard to the remaining ones of the FIGS. 1-16.

While inventive concepts have been particularly shown and described with reference to example embodiments thereof, it will be understood by those of ordinary skill in the art that various changes in forms and details may be made therein without departing from the spirit and scope of the inventive concept as defined by the following claims.

What is claimed is:

1. A semiconductor system comprising:
    a logic die configured to generate first temperature information of the logic die, the first temperature information being based on at least one temperature measurement using at least one first temperature sensor;
    a first random access memory (RAM) die stacked on the logic die; and
    a second RAM die stacked on the first RAM die, wherein
        at least one of the first RAM die and the second RAM die includes a second temperature sensor configured to operate based on at least the first temperature information, and to generate a control signal based on the first temperature information and a temperature measured by the second temperature sensor, the control signal including an instruction to adjust an operation performed on the at least one of the first RAM die and the second RAM die generating the control signal, and the control signal being associated with determining a refresh interval of the operation performed on the at least one of the first RAM die and the second RAM die generating the control signal.

2. The semiconductor system of claim 1, wherein the first RAM die and the second RAM die are each a dynamic random access memory (DRAM) die.

3. The semiconductor system of claim 1, wherein the first RAM die or the second RAM die has the refresh interval corresponding to a short refresh interval when the temperature measured by the second temperature sensor increases.

4. The semiconductor system of claim 1, further comprising:
    a plurality of through silicon vias (TSVs) extending through the first RAM die and the second RAM die so as to connect to the logic die.

5. The semiconductor system of claim 1, wherein the second temperature sensor comprises:
    a sensor activation block configured to generate a start-up signal, the start-up signal being enabled based on the first temperature information; and
    a temperature sensor block configured to,
        activate based on the start-up signal, and
        generate a temperature code such that the temperature code corresponds to a result of the temperature measured by the second temperature sensor.

6. The semiconductor system of claim 5, wherein the sensor activation block is configured to generate the start-up signal such that the start-up signal is enabled within a period of time when a master signal in the first temperature information switches from a low level to a high level.

7. The semiconductor system of claim 5, wherein the second temperature sensor further comprises:
    a voting block configured to,
        verify the temperature code, and
        generate a verified temperature code;
    a compensation block configured to adjust the verified temperature code based on the first temperature information to generate a compensated temperature code; and
    an internal control block configured to generate the control signal based on the compensated temperature code, the control signal being associated with controlling an operation of the second RAM die.

8. The semiconductor system of claim 7, wherein the voting block is configured to change a verification range for the temperature code according to a master signal in the first temperature information.

9. A semiconductor system comprising:
    a logic die configured to generate first temperature information based on a temperature of the logic die;
    a first dynamic random access memory (DRAM) die stacked on the logic die; and
    a second DRAM die stacked on the first DRAM die, wherein
        at least one of the first DRAM die and the second DRAM die is configured to generate a control signal based on the first temperature information and a temperature of the at least one of the first DRAM die and the second DRAM die, the control signal including an instruction to adjust an operation performed on the at least one of the first DRAM die generating the control signal and the second DRAM die, and the control signal being associated with determining a refresh interval of the operation performed on the first DRAM die or the second DRAM die.

10. The semiconductor system of claim 9, wherein the at least one of the first DRAM die and the second DRAM die has the refresh interval corresponding to a short refresh interval when the temperature of the at least one of the first DRAM die and the second DRAM die increases.

11. The semiconductor system of claim 9, further comprising:
    a plurality of through silicon vias (TSVs) extending through the first and the second DRAM die so as to connect to the logic die.

12. The semiconductor system of claim 9, wherein the at least one of the first DRAM die and the second DRAM die includes a second temperature sensor configured to operate based on at least the first temperature information, the second temperature sensor comprising:
    a sensor activation block configured to generate a start-up signal, the start-up signal being enabled based on the first temperature information; and
    a temperature sensor block configured to,
        activate based on the start-up signal, and
        generate a temperature code such that the temperature code corresponds to a result of a temperature measured by the second temperature sensor.

13. The semiconductor system of claim 12, wherein the sensor activation block is configured to generate the start-up signal such that the start-up signal is enabled within a period of time when a master signal in the first temperature information switches from a low level to a high level.

14. The semiconductor system of claim 12, wherein the second temperature sensor further comprises:
    a voting block configured to,
        verify the temperature code, and
        generate a verified temperature code;

a compensation block configured to adjust the verified temperature code based on the first temperature information to generate a compensated temperature code; and an internal control block configured to generate the control signal based on the compensated temperature code, the control signal being associated with controlling an operation of the second DRAM die.

15. The semiconductor system of claim 14, wherein the voting block is configured to change a verification range for the temperature code according to a master signal in the first temperature information.

16. A semiconductor system comprising:

a logic die including a first memory controller, the first memory controller configured to generate first temperature information of the logic die based on at least one temperature measurement using at least one first temperature sensor;

a first random access memory (RAM) die including a first memory cell array stacked on the logic die; and a second RAM die including a second memory cell array stacked on the first RAM die, wherein at least one of the first RAM die and the second RAM die is configured to generate a control signal based on the first temperature information and a temperature of the at least one of the first RAM die and the second RAM die generating the control signal, the control signal including an instruction to adjust an operation performed on the at least one of the first RAM die and the second RAM die generating the control signal, and the control signal being associated with determining a refresh interval of the operation performed on the at least one of the first RAM die or the second RAM die generating the control signal.

17. The semiconductor system of claim 16, wherein the first RAM die includes a second memory controller, and the second RAM die includes a third memory controller.

18. The semiconductor system of claim 16, wherein the first RAM die or the second RAM die has the refresh interval corresponding to a short refresh interval when the temperature of the at least one of the first RAM die and the second RAM die generating the control signal increases.

19. The semiconductor system of claim 16, further comprising:

a plurality of through silicon vias (TSVs) extending through the first RAM die and the second RAM die so as to connect to the logic die.

20. The semiconductor system of claim 16, wherein the first and the second memory cell arrays are each a dynamic random access memory (DRAM) cell array.

* * * * *